US012794195B2

(12) United States Patent
Kapraun et al.

(10) Patent No.: US 12,794,195 B2
(45) Date of Patent: Nov. 10, 2026

(54) VERTICAL CAVITY SURFACE EMITTING LASER

(71) Applicant: ZHEJIANG BERXEL PHOTONICS CO., LTD., Jiaxing City (CN)

(72) Inventors: Jonas Horst Kapraun, Jiaxing City (CN); Yao Cui, Jiaxing City (CN); Yipeng Ji, Jiaxing City (CN); Constance Jui-hua Chang-Hasnain, Jiaxing City (CN); Chihchiang Shen, Jiaxing City (CN)

(73) Assignee: ZHEJIANG BERXEL PHOTONICS CO., LTD.

( * ) Notice: Subject to any disclaimer, the term of this patent is extended or adjusted under 35 U.S.C. 154(b) by 727 days.

(21) Appl. No.: 18/138,446

(22) Filed: Apr. 24, 2023

(65) Prior Publication Data

US 2024/0332905 A1 Oct. 3, 2024

(30) Foreign Application Priority Data

Mar. 31, 2023 (CN) ......................... 202310353615.1

(51) Int. Cl.
*H01S 5/183* (2006.01)
*H01S 5/068* (2006.01)

(52) U.S. Cl.
CPC ...... *H01S 5/18361* (2013.01); *H01S 5/06821* (2013.01); *H01S 5/18355* (2013.01)

(58) Field of Classification Search
CPC ............... H01S 5/18355; H01S 5/1836; H01S 5/18386; H01S 5/06821; H01S 5/209;
(Continued)

(56) References Cited

U.S. PATENT DOCUMENTS 8,000,374 B2 * 8/2011 Johnson .............. H01S 5/18355 372/99
2009/0097522 A1 4/2009 Justice et al.
(Continued)

FOREIGN PATENT DOCUMENTS

CN 104319628 A 1/2015
CN 111769437 A 10/2020
(Continued)

OTHER PUBLICATIONS

Liao, W., Li, C., Li, J. et al. Polarization control and mode optimization of 850 nm multi-mode VCSELs using surface grating. Appl. Phys. B 127, 23. https://doi.org/10.1007/s00340-020-07570-w (Year: 2021).*
(Continued)

*Primary Examiner* — Tod T Van Roy
*Assistant Examiner* — Jasmin Kaur Mundi
(74) *Attorney, Agent, or Firm* — THE SUN IP LAW

(57) ABSTRACT

The present disclosure provides a vertical cavity surface emitting laser, relating to the technical field of photoelectric devices. The vertical cavity surface emitting laser includes a substrate layer, a buffer layer, a first reflector layer, a light emitting layer, a polarization selective hybrid layer and an electrode layer that are stacked. The polarization selective hybrid layer includes a second reflector layer and a near wavelength grating layer integrated above the second reflector layer, where a period of a near wavelength grating is smaller than a wavelength of light in a propagating medium and larger than a wavelength of light in a semiconductor material of the vertical cavity surface emitting laser. The vertical cavity surface emitting laser can emit highly stable and highly polarized laser light, and is simple in structure and convenient to fabricate. The second reflector layer is thinner, which reduces the production cost.

14 Claims, 5 Drawing Sheets

(58) Field of Classification Search
CPC ............... H01S 5/0421; H01S 5/04253; H01S 5/04254; H01S 5/18311; H01S 5/18302; H01S 5/0682; H01S 5/1221; H01S 5/18361; H01S 2301/173
See application file for complete search history.

(56) References Cited

U.S. PATENT DOCUMENTS

| | | | | |
|---|---|---|---|---|
| 2011/0317540 | A1* | 12/2011 | Matsushita | H01S 5/18386 |
| 2019/0252857 | A1* | 8/2019 | Qiao | H01S 5/18355 |
| 2021/0167580 | A1* | 6/2021 | Qiao | H01S 5/0057 |

FOREIGN PATENT DOCUMENTS

| | | | | | |
|---|---|---|---|---|---|
| CN | 112366513 | A | * | 2/2021 | H01S 5/0282 |
| CN | 113659436 | A | | 11/2021 | |
| CN | 113795985 | A | | 12/2021 | |
| CN | 219874445 | U | | 10/2023 | |
| JP | 2003209283 | A | | 7/2003 | |
| JP | 2022085870 | A | | 6/2022 | |
| JP | 2023024359 | A | | 2/2023 | |
| TW | 202121784 | A | | 6/2021 | |

OTHER PUBLICATIONS

The First Office Action for Chinese Patent Application No. 2023103536151, issued on Jun. 5, 2025.
Liao Wenyuan et al., Polarization control and mode optimization of 850 nm multi-mode VCSELs using surface grating, Jan. 20, 2021, DOI: 10.1007/s00340-020-07570-w.
Fu Qiuxue et al., Polarization control of 795 nm vertical-cavity surface-emitting lasers by in-phase surface gratings, Sep. 23, 2022, DOI: 10.1364/AO.472435.
Li Ming et al., 894nm high orthogonal polarization suppression ratio wertical cavity surface emitting laser, Feb. 24, 2020, DOI: 10.1117/12.2544281.
Extended European Search Report for EP No. 23175797.2 issued on Oct. 17, 2023.
Japanese Patent Office The First Office Action for JP No. 2023087496—issued on Jan. 30, 2023 (with translation).
Japanese Patent Office The Second Office Action for JP No. 2023087496, issued on Jul. 2, 2024 (with translation).
The First Office Action for Taiwan Patent Application No. TW112118727, issued on Nov. 6, 2023 (with translation).
Yi Rao et al., Feb. 12, 2013, Long-Wavelength VCSEL Using High-Contrast Grating. IEEE Journal of Selected Topics in Quantum Electronics, 19(4), 1701311-1701311. doi: 10.1109/jstqe.2013.2246780.
Taiwan Patent Application No. TW112118727—Search Report,issued on Nov. 8, 2023.
Japanese Patent Office No. 2023087493—Search Report, issued on Jan. 30, 2024.
The Second Office Action for Chinese Patent Application No. 202310353615.1, issued on Mar. 6, 2026.

* cited by examiner (a) (b) (c)

(a) (b) (c) (d)

(a) (b)

(a) (b) (c) (d)

VERTICAL CAVITY SURFACE EMITTING LASER

CROSS REFERENCE TO RELATED APPLICATION

The present disclosure claims the benefit of priorities to Chinese patent application No. 202310353615.1, filed on Mar. 31, 2023 to China National Intellectual Property Administration and entitled "Vertical Cavity Surface Emitting Laser", which is incorporated herein by reference in its entirety.

TECHNICAL FIELD

The present disclosure generally relates to the technical field of photoelectric devices, in particular to a vertical cavity surface emitting laser.

BACKGROUND

Vertical cavity surface emitting lasers (VCSELs) have the advantages of small size, long life, and low threshold current, and have been widely used in high-speed optical chips, data centers, structured light, LIDAR, etc.

The laser light emission of conventional VCSELs shows varying degrees of polarization dependent on the device design, manufacturing conditions as well as highly complex patterns of spontaneous polarization switching under various operating conditions. Currently, diffraction gratings and subwavelength gratings have been used in related technologies to demonstrate VCSELs with stabilized polarization, but each of these configurations suffers from particular drawbacks. For example, diffraction gratings with a period larger than the wavelength of the laser light are straight forward to fabricate because of their large feature sizes, but suffer from significant performance reduction caused by higher order diffraction losses. For another example, subwavelength gratings require periods smaller than the wavelength of the laser light and are formed based on special epitaxy, leading to a huge manufacturing challenge and an increase in production cost.

SUMMARY

In view of the above drawbacks or deficiencies in the related technologies, it is expected to provide a vertical cavity surface emitting laser, which is simple in structure, convenient to fabricate, and low in cost.

The present disclosure provides a vertical cavity surface emitting laser. The vertical cavity surface emitting laser includes a substrate layer, a buffer layer, a first reflector layer, a light emitting layer, a polarization selective hybrid layer and an electrode layer that are stacked. The polarization selective hybrid layer includes a second reflector layer and a near wavelength grating layer integrated above the second reflector layer, where a period of a near wavelength grating is smaller than a wavelength of light in a propagating medium and larger than a wavelength of light in a semiconductor material of the vertical cavity surface emitting laser.

In some embodiments of the present disclosure, the near wavelength grating is formed by etching a cap layer in the second reflector layer.

In some embodiments of the present disclosure, a shape of a corresponding region of the near wavelength grating includes at least one of a polygon and a circle.

In some embodiments of the present disclosure, at least one conformal layer is provided on an outer surface of the near wavelength grating.

In some embodiments of the present disclosure, when the cumulative thickness of the conformal layers exceeds a preset threshold, a planarized layer is further provided above the conformal layers, and there are gaps between the planarized layer and the conformal layers.

In some embodiments of the present disclosure, the conformal layer and the planarized layer include at least one of a SiN layer, an $Al_2O_3$ layer, a $TiO_2$ layer and a $SiO_2$ layer, respectively.

In some embodiments of the present disclosure, at least one stopping layer is provided below the near wavelength grating.

In some embodiments of the present disclosure, the bottom of the near wavelength grating is located above the stopping layer; or the bottom of the near wavelength grating penetrates the stopping layer and reaches the interior of the cap layer in the second reflector layer.

In some embodiments of the present disclosure, the stopping layer includes at least one of a Si layer, a Ge layer, a GaN layer, an AlGaN layer, a GaAs layer, an AlGaAs layer, an InGaP layer, an InGaAs layer and an AlAs layer.

In some embodiments of the present disclosure, the light emitting layer includes an active layer and an oxide layer that are stacked, and the oxide layer includes an unoxidized region for emitting laser light and an oxidized region surrounding the unoxidized region.

It can be seen from the foregoing technical solution that the embodiments of the present disclosure have the following advantages.

The embodiments of the present disclosure provide a vertical cavity surface emitting laser in which the near wavelength grating layer is integrated with the second reflector layer, where the period of the near wavelength grating is smaller than the wavelength of light in the propagating medium and larger than the wavelength of light in the semiconductor material of the laser, thereby forming a polarization selective hybrid layer of a laser cavity, so that highly stable and highly polarized laser light can be emitted, the vertical cavity surface emitting laser is simple in structure and convenient to fabricate, the second reflector layer is thinner, and the production cost is reduced.

BRIEF DESCRIPTION OF FIGURES

Other features, objectives and advantages of the present disclosure will become more apparent by reading the detailed description of non-limiting embodiments with reference to the accompanying drawings below.

REFERENCE NUMERALS

10—vertical cavity surface emitting laser, 11—substrate layer, 12—buffer layer, 13—first reflector layer, 14—light emitting layer, 141—active layer, 142—oxidized layer, 143—unoxidized region, 144—oxidized region, 15—polarization selective hybrid layer, 151—second reflector layer, 1511—cap layer, 152—near wavelength grating layer, 153—conformal layer, 154—planarized layer, 155—interface, 156—gap, 157—stopping layer, and 16—electrode layer.

DETAILED DESCRIPTION

To make a person skilled in the art understand the solutions in the present disclosure better, the following clearly and completely describes the technical solutions in the embodiments of the present disclosure with reference to the accompanying drawings in the embodiments of the present disclosure. Apparently, the described embodiments are merely some rather than all of the embodiments of the present disclosure. All other embodiments obtained by those of ordinary skill in the art based on the embodiments of the present disclosure without any creative efforts shall fall within the protection scope of the present disclosure.

In the specification and claims of the present disclosure and the foregoing accompanying drawings, the terms “first”, “second”, “third”, “fourth”, and the like (if any) are intended to distinguish between similar objects, but do not necessarily describe a specific order or sequence. It should be understood that the data used in this way is interchangeable in appropriate circumstances, so that the described embodiments of the present disclosure can be implemented in other orders than the order illustrated or described herein.

Moreover, the terms “include”, “contain” and any other variants mean to cover the non-exclusive inclusion. For example, a process, method, system, product, or device that includes a list of steps or modules is not necessarily limited to those expressly listed steps or modules, but may include other steps or modules not expressly listed or inherent to such a process, method, product, or device.

For ease of understanding and explanation, a vertical cavity surface emitting laser according to an embodiment of the present disclosure is described in detail below through FIG. 1 to FIG. 15.

Figure 1:
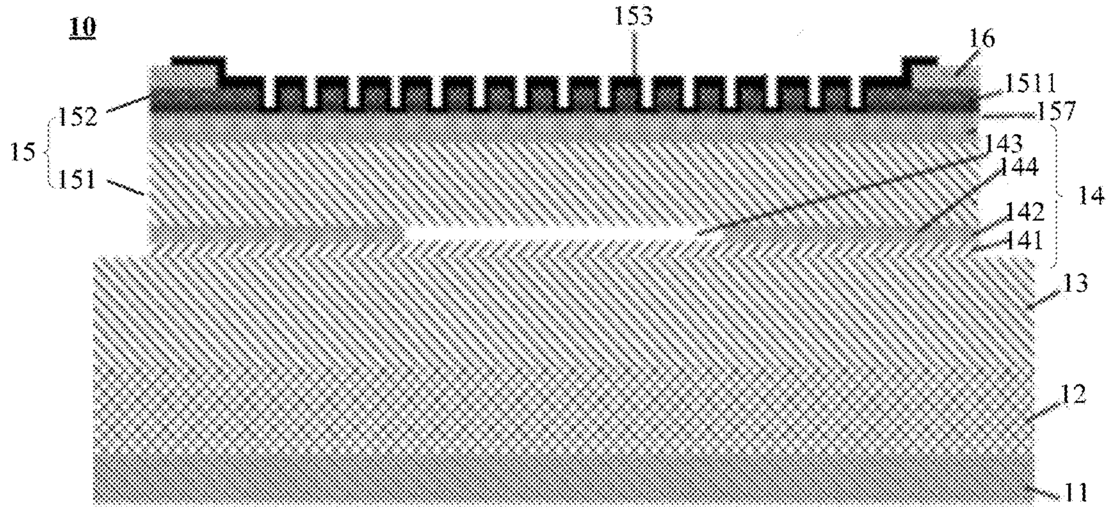
FIG. 1 is a schematic structural diagram of a vertical cavity surface emitting laser according to an embodiment of the present disclosure.

FIG. 1 is a schematic structural diagram of a vertical cavity surface emitting laser according to an embodiment of the present disclosure. The vertical cavity surface emitting laser 10 includes a substrate layer 11, a buffer layer 12, a first reflector layer 13, a light emitting layer 14, a polarization selective hybrid layer 15 and an electrode layer 16 that are stacked. The polarization selective hybrid layer 15 includes a second reflector layer 151 and a near wavelength grating layer 152 integrated above the second reflector layer 151, where a period of a near wavelength grating is smaller than a wavelength of light in a propagating medium (i.e., air) and larger than a wavelength of light in a semiconductor material of the vertical cavity surface emitting laser 10. As a result, any losses from higher diffraction orders in transmission direction are completely eliminated, and losses from higher diffraction orders in reflection direction are minimized by suitably engineered bar width, gap and etch depth of the grating.

The near wavelength grating in an embodiment of the present disclosure is formed by etching a cap layer 1511 in the second reflector layer 151. Such configuration has the advantages i) that no changes have to be made to already existing epitaxial designs and that fabrication is convenient, and ii) that vertical cavity surface emitting lasers 10 can be fabricated side by side with conventional vertical cavity surface emitting lasers and that both types of devices can be integrated into arrays. In addition, the far field of the vertical cavity surface emitting lasers 10 and the far field of the conventional vertical cavity surface emitting lasers can be substantially similar.

It should be noted that the first reflector layer 13 and the second reflector layer 151 in the embodiments of the present disclosure can be distributed Bragg reflector (DBR) layers. Further, the reflectivity of the polarization selective hybrid layer for light of the desired polarization direction is designed to match the reflectivity of the DBR alone. At the same time the reflectivity of the hybrid reflector for light of the undesired polarization direction is greater than a threshold value and less than the reflectivity of the hybrid reflector for light of the desired polarization. This reflectivity difference of the polarization selective hybrid layer 15 can be any value larger than 0.5, 0.8, 1, 1.5, 2, 3, 5, 10 or 20%. The larger the difference in reflectivity is, the greater the degree of polarization of the laser light and the more stable the polarization of the laser light for various operation conditions, i.e., different drive currents of the laser, different temperatures, etc. The degree of polarization of the laser light can be greater than 5 dB, 7 dB, 10 dB, 15 dB, 20 dB and 30 dB. The diffraction loss due to the near wavelength grating is minimized by suitable design and can be smaller than 50%, 30%, 20%, 15%, 10%, 7%, 5%, 3%, 2%, 1% and 0.5%. The integration of the near wavelength grating into the laser reflector has the benefit that the performance penalty to the laser is most only influenced by the diffraction loss of the grating in the desired polarization direction of the laser light.

Conversely, diffraction losses for light with the undesired polarization direction have a minute influence on the laser performance.

Figure 2:
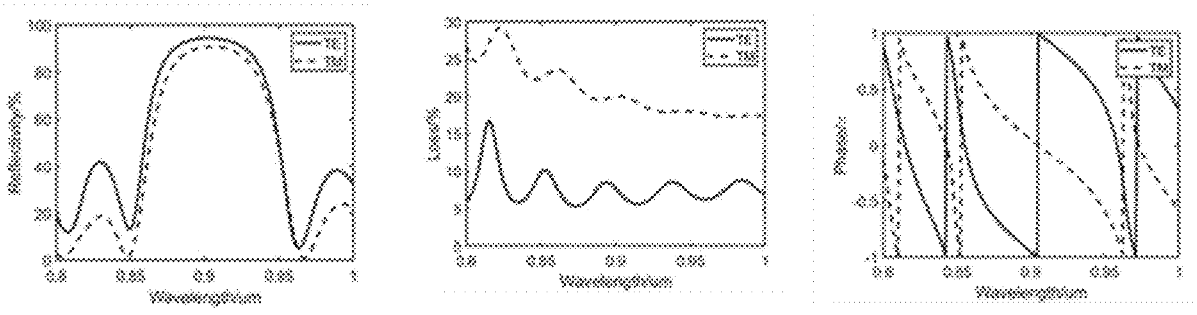
FIG. 2 is a schematic diagram of reflectivity, diffraction loss, and phase obtained by RCWA calculations according to an embodiment of the present disclosure.

FIG. 2 shows reflectivity, diffraction loss and phase obtained by RCWA (Rigorous Coupled Wave Analysis) calculations according to an embodiment of the present disclosure. The desired polarization of the laser light is TE. For this polarization, the hybrid reflector has an enhanced reflectivity, which is designed to match the reflectivity of the second reflector layer 151 without the near wavelength grating and optimizes laser performance such as power, threshold, and slope efficiency. For this polarization, the hybrid reflector has enhanced reflectivity, which is designed to match the reflectivity of the second reflector layer 151 without a near wavelength grating, and optimize the performance of the laser such as power, threshold, and slope efficiency. The polarization selective hybrid layer 15 has a designed low diffraction loss of smaller than 10% in TE, which minimizes the impact on the laser performance. The significantly higher diffraction loss between 20-25% for TM light has practically no influence on the laser performance. Single pass phase of the hybrid reflector is close to $\pi$ and 0 for TE and TM light respectively, meaning that for light of both polarization directions, the VCSELs round trip phase condition of multiples of $2\pi$ is satisfied. Total phase of the hybrid reflector is dependent on layer thicknesses of the DBR, design of the cap layer 1511 of the DBR and grating parameters such as period, bar width, gap and etch depth.

Figure 3:
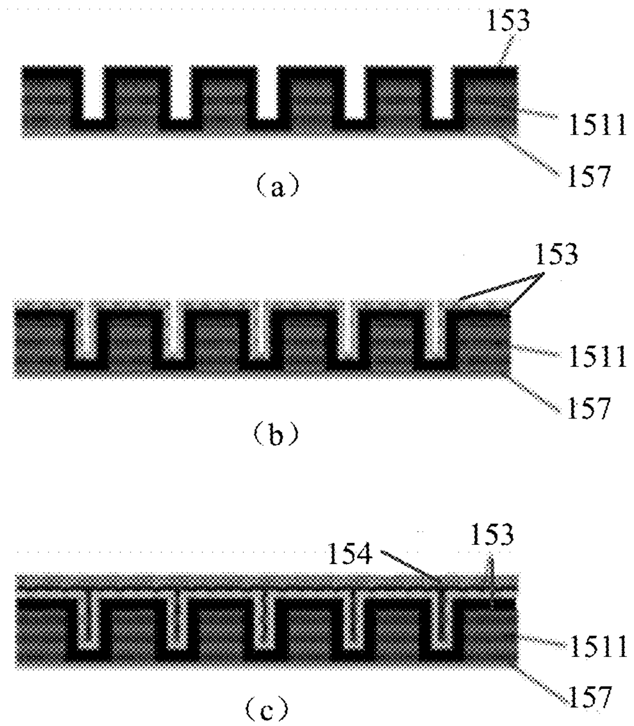
FIG. 3 is a schematic diagram of one conformal layer, two conformal layers, and a plurality of conformal layers according to an embodiment of the present disclosure.
Figure 4:
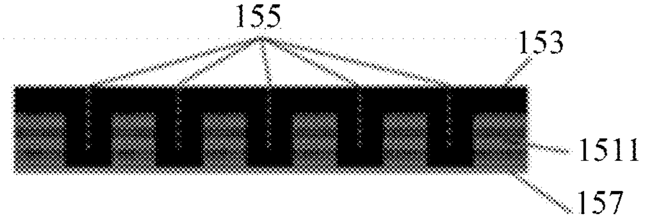
FIG. 4 is another schematic diagram of a plurality of conformal layers according to an embodiment of the present disclosure.
Figure 5:
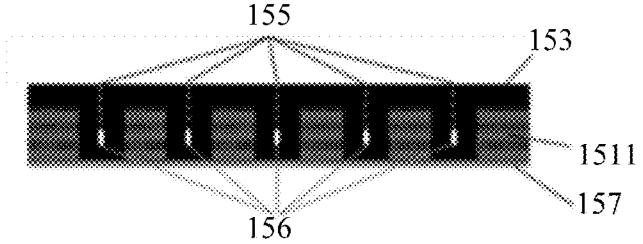
FIG. 5 is still another schematic diagram of a plurality of conformal layers according to an embodiment of the present disclosure.

At least one conformal layer 153 is provided on an outer surface of the near wavelength grating in an embodiment of the present disclosure, which has the benefit that the reliability and optical characteristics of the vertical cavity surface emitting laser 10 can be improved. For example, FIG. 3 shows one conformal layer, two conformal layers, and a plurality of conformal layers according to an embodiment of the present disclosure. When the cumulative thickness of the conformal layers 153 exceeds a preset threshold, the grating gap with the structures gets planarized. A planarized layer 154 is provided above the conformal layers 153. The preset threshold can be 0.5× the height of the grating gap. Further, FIG. 4 shows how the perfectly conformal layers 153 combine along interfaces 155 to achieve planarization. FIG. 5 shows how the conformal layers 153 combine along the interfaces 155 and forms gaps 156 when the planarization is achieved. It should be noted that the conformal layers 153 and the planarized layer 154 in the embodiments of the present disclosure can be made of inorganic dielectric materials, such as at least one of a SiN layer, an $Al_2O_3$ layer, a $TiO_2$ layer and a $SiO_2$ layer, respectively, and can be formed by methods such as ALD (Atomic Layer Deposition), PECVD (Plasma Enhanced Chemical Vapor Deposition), CVD (Chemical Vapor Deposition), PVD (Physical Vapor Deposition), sputter, etc.

Figure 6:
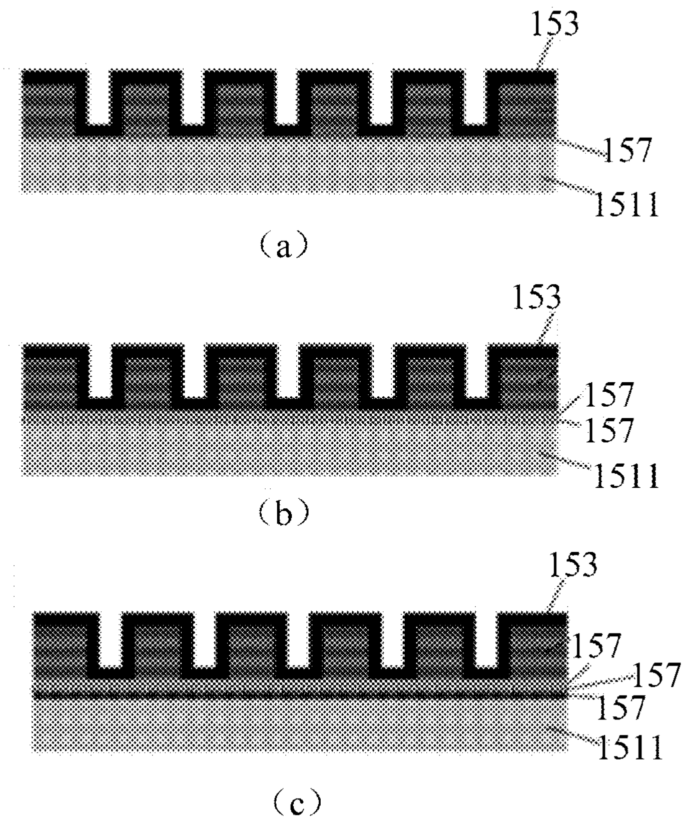
FIG. 6 is a schematic diagram of one stopping layer, two stopping layers, and a plurality of stopping layers according to an embodiment of the present disclosure.
Figure 7:
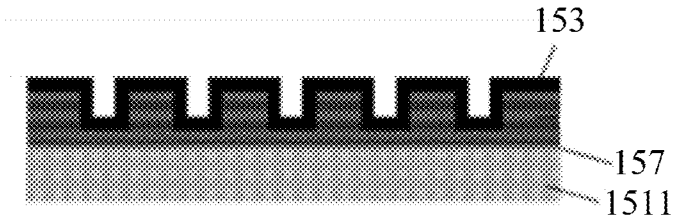
FIG. 7 is a schematic diagram of a positional relationship between a near wavelength grating and a stopping layer according to an embodiment of the present disclosure.
Figure 8:
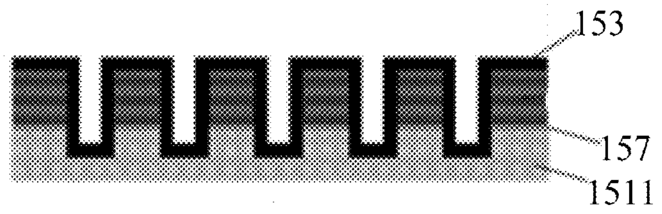
FIG. 8 is another schematic diagram of a positional relationship between a near wavelength grating and a stopping layer according to an embodiment of the present disclosure.

In another embodiment of the present disclosure, at least one stopping layer 157 is provided below the near wavelength grating. The stopping layer 157 can be used for etch stop or propagating defect stop, thereby enhancing the uniformity of the etch depth of the grating, improving the shape of the cross section of the grating gap, and increasing the accuracy of the etch depth of the grating gap. For example, the etch forming the grating gap has greater than a threshold level of selectivity of i.e., 1.5:1, 2:1, 3:1, 5:1, 10:1, 20:1, 50:1, 100:1, etc. with respect to the material of the stopping layer 157 and relative to the material of the cap layer 1511 of the second reflector layer 151. At the same time, the reliability of the vertical cavity surface emitting laser 10 is also improved. The stopping layer 157 and the cap layer 1511 of the second reflector layer 151 can be formed by methods such as MOCVD (Metal-organic Chemical Vapor Deposition), MBE (Molecular Beam Epitaxy), LPE (Liquid Phase Epitaxy), etc. during structural epitaxial growth of the vertical cavity surface emitting laser 10. For example, FIG. 6 shows one stopping layer, two stopping layers, and a plurality of stopping layers according to an embodiment of the present disclosure. Further, as shown in FIG. 7, the bottom of the near wavelength grating is located above the stopping layer 157; or as shown in FIG. 8, the bottom of the near wavelength grating penetrates the stopping layer 157 and reaches the interior of the cap layer 1511 in the second reflector layer 151. It should be noted that the stopping layer 157 in the embodiments of the present disclosure can be made of a semiconductor material, and includes, for example, at least one of a Si layer, a Ge layer, a GaN layer, an AlGaN layer, a GaAs layer, an AlGaAs layer, an InGaP layer, an InGaAs layer and an AlAs layer. The refractive index of the stopping layer 157 may be close to or closely match the refractive index of the material constituting the cap layer 1511 of the second reflector layer 151, and the stopping layer 157 may have a thickness smaller than $\lambda/4$, $\lambda/6$, $\lambda/8$, $\lambda/10$ or smaller than 50 nm, 20 nm, 10 nm, 7 nm, 5 nm, where $\lambda$ represents laser light wavelength.

In yet another embodiment of the present disclosure, the light emitting layer 14 includes an active layer 141 and an oxide layer 142 that are stacked. The oxide layer 142 includes an unoxidized region 143 for emitting laser light and an oxidized region 144 surrounding the unoxidized region 143. For example, the oxide layer 142 may include an aluminum material, the emitted laser light is in a near infrared range, and the polarization direction is parallel to bars of the near wavelength grating. The active layer 141 is a single quantum well layer or a multiple quantum well (MQW) layer for emitting light when powered on. The unoxidized region 143 is a conductive region. After a voltage is applied to electrodes at two ends of the vertical cavity surface emitting laser 10, current is transmitted through the unoxidized region 143. The oxidized region 144 is an insulating region for insulating the current.

Figure 9:
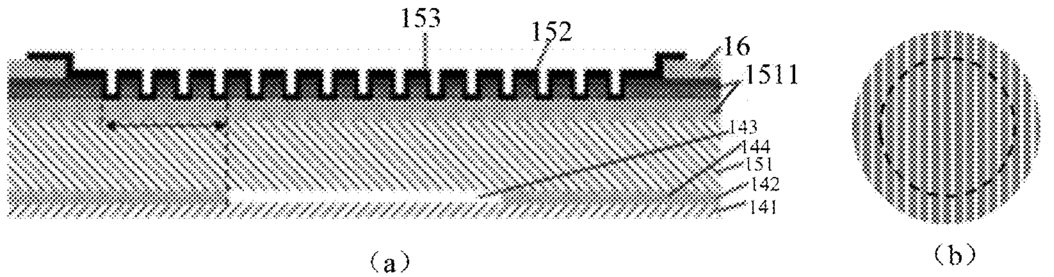
FIG. 9 is a schematic diagram of a relationship between a size of a corresponding region of a near wavelength grating and a size of an unoxidized region according to an embodiment of the present disclosure.
Figure 10:
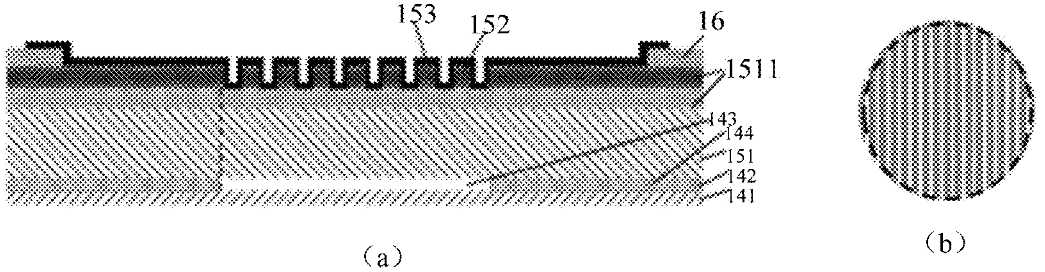
FIG. 10 is another schematic diagram of a relationship between a size of a corresponding region of a near wavelength grating and a size of an unoxidized region according to an embodiment of the present disclosure.
Figure 11:
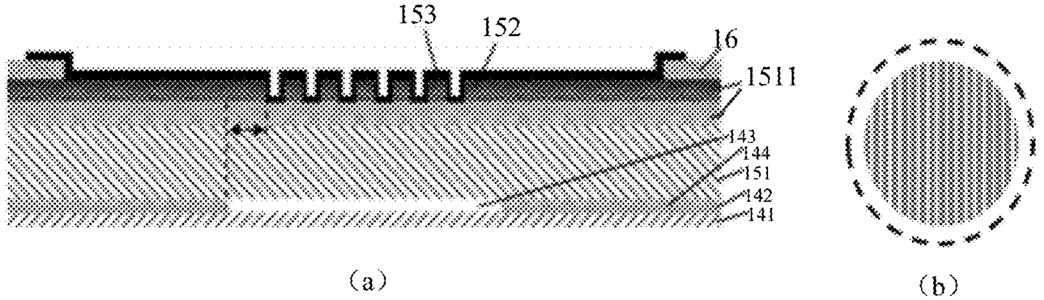
FIG. 11 is still another schematic diagram of a relationship between a size of a corresponding region of a near wavelength grating and a size of an unoxidized region according to an embodiment of the present disclosure.

Further, as shown in FIG. 9, the corresponding region of the near wavelength grating can be larger than the unoxidized region 143 in the embodiments of the present disclosure, which results in polarization of substantially all laser modes in the vertical cavity surface emitting laser 10. The size of the corresponding region of the near wavelength grating can be equal to that of the unoxidized region 143 as shown in FIG. 10. Alternatively, the size of the corresponding region of the near wavelength grating can be smaller than that of the unoxidized region 143 as shown in FIG. 11. In this case a number of lasing transverse modes of the vertical cavity surface emitting laser 10 are polarized, i.e., the fundamental mode is polarized. Depending on the relative reflectivity of the area with grating of the hybrid reflector to the area without grating, a number of lasing transverse modes can be polarized and another number of modes can be non-polarized, when the reflectivity of the hybrid reflector and the reflectivity of the second reflector layer 151 alone are substantially matched. In the case that the reflectivity of the hybrid reflector is higher than that of the second reflector layer 151 alone, a number of polarized modes of the vertical cavity surface emitting laser 10 will lase preferentially to a number of non-polarized modes.

Figure 12:
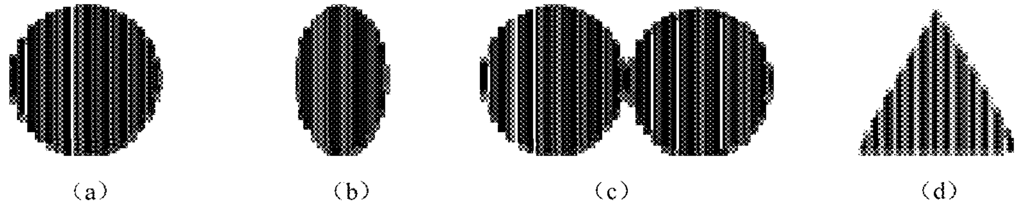
FIG. 12 is a schematic diagram of a grating region in different shapes according to an embodiment of the present disclosure.
Figure 13:
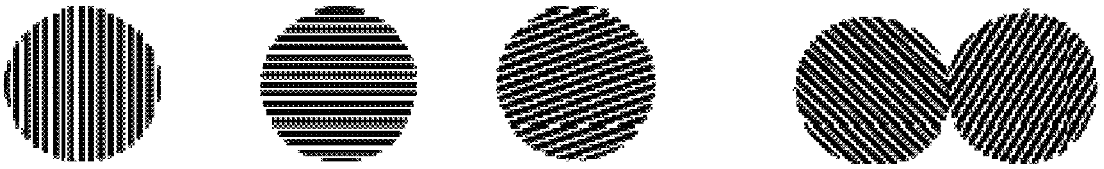
FIG. 13 is a schematic diagram of a grating element in different directions according to an embodiment of the present disclosure.

The shape of the corresponding region of the near wavelength grating in an embodiment of the present disclosure can include at least one of a polygon and a circle. The polygon includes but is not limited to a triangle, a quadrangle, etc. The circle includes but is not limited to a regular circle, an ellipse, etc. For example, as shown in FIG. 12 and FIG. 13, the area of the grating of the hybrid reflector can be designed with various shapes and orientations in such ways that specific transverse modes of the vertical cavity surface emitting laser 10 will be polarized. Depending on the relative reflectivity of the area with grating of the hybrid reflector to the area without grating, the vertical cavity surface emitting laser 10 will preferably emit light of specific polarized transverse modes or will emit light of specific polarized transverse modes and non-polarized light of other transverse modes. The shape and orientation of the grating portion of the hybrid reflector are designed such that the vertical cavity surface emitting laser 10 lases with a desired polarization direction in specific transverse modes. Direction of linear polarized emission can be controlled by rotation. Circular polarized light can be controlled by chiral structures.

Figure 14:
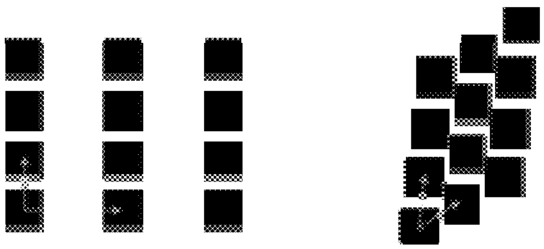
FIG. 14 is a schematic diagram of grids of a grating according to an embodiment of the present disclosure.
Figure 15:
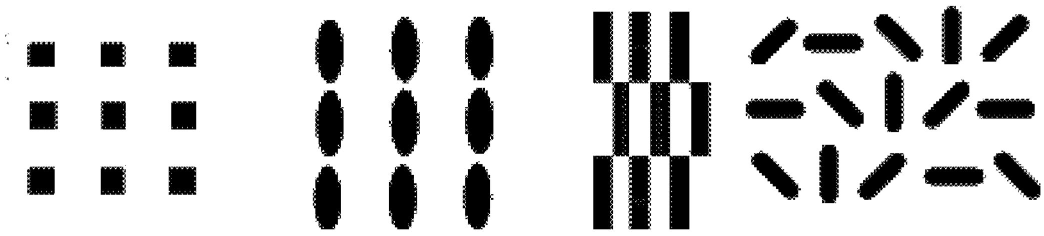
FIG. 15 is a schematic diagram of unit cells of a grating according to an embodiment of the present disclosure.

In addition, FIG. 14 and FIG. 15 show grids and unit cells of a grating according to an embodiment of the present disclosure, respectively. A 2D grating structure can be defined by a grid shown in FIG. 14 and is combined with a particular grating element or a unit cell shown in FIG. 15. It should be appreciated that asymmetric grating elements can be used to design 2D grating based hybrid reflectors that are selective to linear polarized light, and chiral grating elements can be used to design 2D grating based hybrid reflectors that are selective to circular polarized light.

The embodiments of the present disclosure provide a vertical cavity surface emitting laser in which the near wavelength grating layer is integrated with the second reflector layer, where the period of the near wavelength grating is smaller than the wavelength of light in the propagating medium and larger than the wavelength of light in the semiconductor material of the laser, thereby forming a polarization selective hybrid layer of a laser cavity, so that highly stable and highly polarized laser light can be emitted, the vertical cavity surface emitting laser is simple in structure and convenient to fabricate, the second reflector layer is thinner, and the production cost is reduced.

Finally, it should be noted that the foregoing embodiments are merely used to describe, but not to limit, the technical solutions of the present disclosure. Although the present disclosure is described in detail with reference to the foregoing embodiments, those of ordinary skill in the art should understand that they may still modify the technical solutions described in the foregoing embodiments, or equivalently substitute some technical features therein, and these modifications or substitutions do not make the essences of the corresponding technical solutions depart from the spirit and scope of the technical solutions of the embodiments of the present disclosure.

What is claimed is:

1. A vertical cavity surface emitting laser, comprising a substrate layer, a buffer layer, a first reflector layer, a light emitting layer, a polarization selective hybrid layer and an electrode layer that are stacked, the polarization selective hybrid layer comprising a second reflector layer and a near wavelength grating layer integrated above the second reflector layer, wherein a period of a near wavelength grating is smaller than a wavelength of light in a propagating medium and larger than a wavelength of light in a semiconductor material of the vertical cavity surface emitting laser; wherein at least one conformal layer is provided on an outer surface of the near wavelength grating; and wherein when the cumulative thickness of the at least one conformal layer exceeds a preset threshold, a planarized layer is a result of forming the at least one conformal layer with a sufficient thickness, and there are gaps between the planarized layer and the at least one conformal layer.

2. The vertical cavity surface emitting laser according to claim 1, wherein the near wavelength grating is formed by etching a cap layer in the second reflector layer.

3. The vertical cavity surface emitting laser according to claim 2, wherein at least one stopping layer is provided below the near wavelength grating.

4. The vertical cavity surface emitting laser according to claim 3, wherein the bottom of the near wavelength grating is located above the at least one stopping layer; or the bottom of the near wavelength grating penetrates the at least one stopping layer and reaches an interior of the cap layer in the second reflector layer.

5. The vertical cavity surface emitting laser according to claim 3, wherein any one of the at least one stopping layer comprises at least one layer selected from the group consisting of a Si layer, a Ge layer, a GaN layer, an AlGaN layer, a GaAs layer, an AlGaAs layer, an InGaP layer, an InGaAs layer, and an AlAs layer.

6. The vertical cavity surface emitting laser according to claim 1, wherein a shape of an area the near wavelength grating physically occupies comprises at least one of a polygon and a circle.

7. The vertical cavity surface emitting laser according to claim 6, wherein at least one stopping layer is provided below the near wavelength grating.

8. The vertical cavity surface emitting laser according to claim 7, wherein the bottom of the near wavelength grating is located above the at least one stopping layer; or the bottom of the near wavelength grating penetrates the at least one stopping layer and reaches an interior of a cap layer in the second reflector layer.

9. The vertical cavity surface emitting laser according to claim 7, wherein the at least one stopping layer comprises at least one layer selected from the group consisting of a Si layer, a Ge layer, a GaN layer, an AlGaN layer, a GaAs layer, an AlGaAs layer, an InGaP layer, an InGaAs layer, and an AlAs layer.

10. The vertical cavity surface emitting laser according to claim 1, wherein any one of the at least one conformal layer and the planarized layer respectively comprise at least one layer selected from the group consisting of a SiN layer, an $Al_2O_3$ layer, a $TiO_2$ layer, and a $SiO_2$ layer.

11. The vertical cavity surface emitting laser according to claim 1, wherein at least one stopping layer is provided below the near wavelength grating.

12. The vertical cavity surface emitting laser according to claim 11, wherein the bottom of the near wavelength grating is located above the at least one stopping layer; or the bottom of the near wavelength grating penetrates the at least one stopping layer and reaches an interior of a cap layer in the second reflector layer.

13. The vertical cavity surface emitting laser according to claim 11, wherein any one of the at least one stopping layer comprises at least one layer selected from the group consisting of a Si layer, a Ge layer, a GaN layer, an AlGaN layer, a GaAs layer, an AlGaAs layer, an InGaP layer, an InGaAs layer, and an AlAs layer.

14. The vertical cavity surface emitting laser according to claim 1, wherein the light emitting layer comprises an active layer and an oxide layer that are stacked, and the oxide layer comprises an unoxidized region for emitting laser light and an oxidized region surrounding the unoxidized region.

* * * * *